(12) United States Patent
Lamblin et al.

(10) Patent No.: US 10,273,592 B2
(45) Date of Patent: Apr. 30, 2019

(54) METHOD OF FORMING LOCAL NANO/MICRO SIZE STRUCTURES OF ANODIZED METAL

(71) Applicant: Luxembourg Institute of Science and Technology (LIST), Esch/Alzette (LU)

(72) Inventors: Guillaume Lamblin, Leignon (BE); Damien Lenoble, Wellin (BE); Kevin Menguelti, Thionville (FR); Vincent Rogé, Thionville (FR)

(73) Assignee: Luxembourg Institute of Science and Technology (LIST), Esch/Alzette (LU)

( * ) Notice: Subject to any disclaimer, the term of this patent is extended or adjusted under 35 U.S.C. 154(b) by 0 days.

(21) Appl. No.: 15/573,408

(22) PCT Filed: May 12, 2016

(86) PCT No.: PCT/EP2016/060709
§ 371 (c)(1),
(2) Date: Nov. 10, 2017

(87) PCT Pub. No.: WO2016/180926
PCT Pub. Date: Nov. 17, 2016

(65) Prior Publication Data
US 2018/0179657 A1  Jun. 28, 2018

(30) Foreign Application Priority Data

May 13, 2015 (LU) .......................... 92716

(51) Int. Cl.
*C25D 11/04* (2006.01)
*C25D 11/26* (2006.01)
(Continued)

(52) U.S. Cl.
CPC ........ *C25D 11/022* (2013.01); *B81C 1/00031* (2013.01); *B81C 1/00047* (2013.01);
(Continued)

(58) Field of Classification Search
CPC .................................................. C25D 11/022
(Continued)

(56) References Cited

U.S. PATENT DOCUMENTS 3,240,685 A * 3/1966 Maissel ................ H01C 17/262
 204/224 R
3,361,662 A * 1/1968 Sutch ................... C25D 11/022
 204/224 R
(Continued)

FOREIGN PATENT DOCUMENTS

WO  2007058604 A1  5/2007
WO  2007106911 A2  9/2007
(Continued)

OTHER PUBLICATIONS

H. Yin et al., Microelectron Eng., Fabrication and Characterization of Aluminum Oxide Thin Film Micropatterns on the Glass Substrate (2014).
(Continued)

*Primary Examiner* — Brian W Cohen
(74) *Attorney, Agent, or Firm* — James E. Walton (57) ABSTRACT

The invention presents a method for producing micro- or nano-structures of an anodized valve metal on a substrate. The method allows for accurate production of the structures, involves a small number of steps and is highly repeatable.

12 Claims, 5 Drawing Sheets

(51) Int. Cl.
| | |
|---|---|
| *C25D 5/02* | (2006.01) |
| *C25D 5/18* | (2006.01) |
| *C25D 11/02* | (2006.01) |
| *B81C 1/00* | (2006.01) |
| *C23C 14/16* | (2006.01) |
| *C23F 17/00* | (2006.01) |
| *F16K 27/00* | (2006.01) |

(52) U.S. Cl.
CPC .............. *C23C 14/16* (2013.01); *C23F 17/00* (2013.01); *C25D 11/024* (2013.01); *C25D 11/04* (2013.01); *C25D 11/26* (2013.01); *B81B 2201/054* (2013.01); *B81B 2203/0315* (2013.01); *B81C 2201/0114* (2013.01); *F16K 27/00* (2013.01)

(58) Field of Classification Search
USPC .................................................. 205/121, 124
See application file for complete search history.

(56) References Cited

U.S. PATENT DOCUMENTS

| | | |
|---|---|---|
| 2003/0194873 A1 | 10/2003 | Imada et al. |
| 2009/0183992 A1 | 7/2009 | Fredenberg et al. |

FOREIGN PATENT DOCUMENTS

| | | |
|---|---|---|
| WO | 2012007520 A1 | 1/2012 |
| WO | 2012007524 A1 | 1/2012 |
| WO | 2012007554 A1 | 1/2012 |
| WO | 2012054044 A1 | 4/2012 |

OTHER PUBLICATIONS

A. Li et al., Advanced Materials, Fabrication and Microstructuring of Hexagonally Ordered Two-Dimensional Nanopore Arrays in Anodic Alumina (1999).

H. Jha et al., Electrochemistry Communications 9, Area-Selective Microscale Metallization on Porous Anodic Oxide Film of Aluminum (2007), 1596-1601.

X. Zhao et al., Nanotechnology 17, Patterened Anodic Aluminum Oxide Fabricated with a Ta Mask (2006) 35-39.

D. Brevnov et al., Chem. Mater., Patterning of Nanoporous Anodic Aluminum Oxide Arrays by Using Sol-Gel Processing, Photolithography, and Plasma Etching, vol. 16, No. 4, (2004).

International Search Report dated Jul. 6, 2016 for parent PCT application PCT/EP2016/060709.

* cited by examiner

METHOD OF FORMING LOCAL NANO/MICRO SIZE STRUCTURES OF ANODIZED METAL

The present invention relates to a method of forming local nano/micro size structures of anodized metal on conductive or not conductive substrate by electrochemical lithography.

In the context of the present invention, anodization is defined as the growth process of oxides films by electrochemical oxidation. An anodized film is a film fabricated by anodization procedure.

Valve metals are metals that present the property to develop compact and electronic insulating oxide layer when anodized in aqueous electrolyte. Typical valve metals are Aluminum, Titanium, Tantalum, Zirconium, Hafnium and Niobium. Some other metals, such as tin may exhibit valve-metal properties under specific conditions. The oxide films can be dense or porous depending on the anodization process used.

Anodization of valve metals and particularly anodization of Aluminium has been studied for years as it can produce very interesting materials to be integrated into nano and/or microdevices but also to be used in a very large scope of applications like catalysis, electronics, sensing, fluidics, photonic, molecular filtration, energy storage as well as template synthesis or drug delivery. The use of anodic Aluminium oxide organized porous films is currently probably one of the most widely used nanostructures in the nanotechnology field. Anodized metals can undergo compact layer of oxide films but also, depending on the experimental protocol, densely packed arrays of self-organized cylindrical pores or tubes in the metal oxide matrix.

There is a need today to develop straight and simple fabrication means of nano/micro structures over large scales. The realization of straight and simple local nano/micro size structures of anodized metal over large scale would simplify the integration of such oxide materials into nano or micro devices.

Several publications or patents related to the fabrication of patterned anodic aluminium oxides or local nano/micro size structures of anodized metal have already been disclosed.

The publication of Ulrich Gösele et al. (An-Ping Li, Frank Müller, Albert Birner, Kornelius Nielsch, Ulrich Gösele, Advanced Materials, 11,6, 1999) report the fabrication of bares of hexagonally ordered porous Alumina with sizes of 100-400 µm wide, 100-300 µm high and several millimetres long on Aluminium foils. The process of fabrication include at least six steps (without taking into account the classical photolithography bake steps not described in the publication) to prepare such microstructured samples from the pre-prepared hexagonally ordered anodic alumina films: the deposition of an Aluminium transfer layer, the deposition of a photoresist layer, the exposure of the photoresist layer to the photolithography tool followed by the development of the exposed resin, the lift-off procedure of the resin, the lift-off procedure of the Aluminium transfer layer on the area where the resin has not been removed, the removal of the anodic Aluminium oxyde not protected by the resin (and finally the removal of the Aluminium transfer layer on the revealed microstructures). This process is not allowing to selectively create microstructures of anodized Aluminium in a native surrounding pure Aluminium that can or not be selectively removed by any etching process afterwards (or on the opposite, remove the anodic Aluminium oxide and keep the complementary Aluminium).

The publication of Long Que et al. (Haocheng Yin, Xiang Li, Long Que, Microelectronic Engineering, 66-70, 2014) also mention the use of photolithography to fabricate hexagonally ordered or non-ordered porous Alumina with a thickness of a few micrometer over 5 µm wide lines and 10*10 µm2 squares onto glass substrate covered with Indium Tin oxide on which Aluminium has been evaporated. The number of steps involved equals the one needed in the Ulrich Gösele and al. publication (without taking into account the classical photolithography bake steps). As for the publication of Ulrich Gösele et al. this process is not allowing to selectively create microstructures of anodized Aluminium in a native surrounding pure Aluminium that can or not be selectively removed by any etching process afterwards (or on the opposite, remove the anodic Aluminium oxide and keep the complementary Aluminium).

Figure 1:
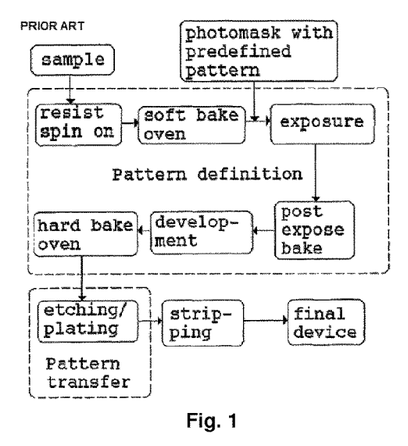
FIG. 1 is a flow sheet of a microfabrication process with a photolithography process known from the prior art.

Patent document WO2012/054044 discloses the use of the photolithography to prepare microstructures based on anodization of two valve metals with two different expansion coefficients. The microstructures formed from the photolithography step can have a size between 1 µm to 1000 µm. No detailed description of the number of steps is given but it appeared to the man skilled in the art that the classical number of steps including resist coating by spin-coating, soft bake of the coated resin into an oven, exposure with the photolithography tool, post exposure bake, development, hard bake and stripping of the remaining resin after the anodization process had to be applied. The photolithography is the only fast and accurate microfabrication common method to pattern nano/micro features over large scale. But, as shown in FIG. 1, it requires an important number of steps which can be time consuming. As for the publication of Ulrich Gösele et al. and Long Que et al. the process described in the patent WO2012/054044 is not allowing to selectively create microstructures of anodized Aluminium in a native surrounding pure Aluminium that can or not be selectively removed by any etching process afterwards (or on the opposite, remove the anodic Aluminium oxide and keep the complementary Aluminium).

The publication of Dimitri A. Brevnov et al. (Dimitri A. Brevnov, Marcos Barela, menace E. Piyasena, Gabriel P. Lopez, Plamen B. Atanassov, Chem Mater, 16, 682-687, 2004) reports the use of photolithography to prepare patterned array of anodized Aluminium. In this work, a Silica sol-gel is deposited on a Silicon wafer covered by Aluminium. After the patterning by photolithography, the authors show that the local anodization of Aluminium can be applied in the non-protected Aluminium areas. No dimensions of the arrays are reported and no description of the photolithographic steps are given but it appeared to the man skilled in the art that the classical number of steps needed to implement photolithography process had to be applied.

The publication of Gang Wang et al. (Xiaowei Zhao, Peng Jiang, Sishen Xie, Jiafeng Feng, Yan Gao, Jianxiong Wang, Dongfang Liu, Li Song, Lifeng Liu, Xinyuan Dou, Shudong Luo, Zengxing Zhang, Yanjuan Xiang, Weiya Zhou and Gang Wang, Nanotechnology, 17, 35-39, 2006) reports the use of a Tantalum mask layer in a photolithographic base method to produce micrometer size anodic Aluminium oxide features. The anodization is taken place after the patterning of the Aluminium by photolithography. No dimensions of the arrays are reported and no description of the photolithographic steps are given but it appeared to the man skilled in the art that the classical number of steps needed to implement photolithography process had to be applied.

Himendra Jha et al. (Himendra Jha, Tatsuya Kikuchi, Masatoshi Sakairi, Hideaki Takahashi1, Electrochemistry communication, 9, 1596-1601, 2007) describe a method for patterning a preformed non organized anodic Aluminium film via laser exposure. The anodic film is locally removed by the laser exposure and micrometer size cells of anodic aluminium film can be formed. As mentioned above, this process is not allowing to selectively create microstructures of anodized Aluminium in a native surrounding pure Aluminium that can or not be selectively removed by any etching process afterwards (or on the opposite, remove the anodic Aluminium oxide and keep the complementary Aluminium). The speed of the laser exposition cannot exceed 40 µm/sec and the sample size mentioned is only of few millimeters. The time needed to be able to realize micrometer depth, wide and length features over large scale sample is then far longer than the one proposed in the present invention. The geometry of the exposed features is also not well controlled and gives rise to non-straight and vertical walls and non-planar and horizontal bottom of the laser drilled cavities.

It is an objective of the present invention to provide a method of forming local nano/micro size structures of anodized metal on conductive or non-conductive substrates, which alleviates at least some of the drawbacks identified in the prior art. It is a particular objective of the invention to provide a method in such a way that above-mentioned high number of steps required by the photolithography technique, or time limitation constraints of laser base techniques are at least partly eliminated or alleviated.

SUMMARY OF THE INVENTION

The invention provides a pattern replication method for production of micro- or nano-structures of an anodized valve metal on a substrate, wherein a replication pattern is defined by an electrically insulating patterned material of a master electrode, and wherein said method comprises the following steps:
  providing a substrate having at least one surface portion that comprises a valve metal;
  placing the master electrode in close contact with said surface portion, so that micro- or nano- cavities are delimited by the insulating pattern of the master electrode and said surface portion;
  charging said cavities with an electrolyte being an aqueous solution of neutral pH or an acid solution of low pH;
  applying a voltage between the master electrode being the cathode and the surface portion being the anode, in order to locally anodize the surface portions inside said micro- or nano-cavities; and
  releasing said master electrode from said substrate.

The electrolyte may preferably be an aqueous solution of neutral pH, between 6 and 8, or an acid solution at low pH between 0 and 5, preferably between 0 and 3.

Preferably, the bottom of each cavity comprises an electrically conductive portion of the master electrode.

The valve metal may comprise Aluminium, Titanium, Tantalum, Zirconium, Hafnium or Niobium. The valve metal may further comprise Iron, Vanadium, Tungsten, Cobalt or Silicon.

Preferably the surface portion comprises an anodized valve metal. The surface portion may be planar, or may have an arbitrary geometry.

The electrolyte may preferably comprise fluorhydric acid, sulfuric acid, picric acid, nitric acid, phosphoric acid, chromic acid, oxalic acid, malonic acid, tartaric acid, malic acid, citric acid, glycolic acid, acetylene dicarboxylic acid, selenic acid or squaric acid.

The substrate may preferably comprise said valve metal. The substrate may be made out of said valve metal.

Alternatively, the substrate may not be electrically conductive. The method may further preferably comprise the step of depositing a layer of valve metal on a portion of said substrate, thereby creating said surface portion.

The electrolyte may preferably be provided on said surface portion of the substrate or in the cavities of the insulating pattern prior to placing said master electrode and said surface portion into contact.

Preferably, a constant voltage may be applied between the anode and the cathode.

Preferably, a pulsed voltage may be applied between the anode and the cathode.

Preferably, a constant current is applied between the anode and the cathode.

Further preferably, the voltage may be applied during 5 to 10 minutes. Longer voltage application times or cycles may also be applied.

According to a further aspect of the invention, the method according to the invention may be used for the production of any of an electronics device, a sensing device, or a filtering device, said device comprising said micro- or nano-structured substrate.

The method according to the present invention simplifies the production of local nano and/or micro size structures of anodized metal over large scale. Substrates carrying such nano and/or micro sized structures are found to be particularly useful in the production of electronics devices, sensing devices or filtering devices, for example. In the present invention a carrier, patterned with an insulating material that define at least one cavity at the bottom of which a conductive material or an electrode material is deposited, and that define an electrically insulated surface, called a master or the master electrode, is pressed against a substrate on which a metal or a combination of metals or an already anodized metal or a combination of already anodized metals have been prepared, are put into contact to be anodized over large scale. Before contact, an electrolyte is applied to cover all the surface of the master or the substrate. After contact, small micro cavities filled-up with electrolyte and sandwiched between the master and the substrate are created and define micro electrochemical cavities in which an anodic current/voltage is applied. The production steps are highly repeatable and the method comprises a small number of steps that may be performed on large scales.

BRIEF DESCRIPTION OF THE FIGURES

Further advantages of the invention will now be described based on specific non-limiting examples and using the figures, among which:
FIG. 4a is a scanning electron microscopy image of the master electrode cavities in accordance with a preferred embodiment of the invention, before being pressed against the aluminium layer;

FIG. 4b is an enlarged view of the feature inside the dashed white rectangle in FIG. 4a;

FIG. 6a is a scanning electron microscopy image of the Aluminium anodized in sulphuric acid (5%) at 12.5V in accordance with a preferred embodiment of the invention;

FIG. 6b is an enlarged view of the feature in the white rectangle in FIG. 6a;

FIG. 6c is an enlarged view of the surface in the white dotted rectangle in FIG. 4b;

FIG. 6d is an enlarged view of the surface in the white dashed rectangle in FIG. 6b.

FIG. 7a is an energy-dispersive X-ray spectroscopy image of the Aluminium anodized in sulfuric acid (5%) at 12.5V in accordance with a preferred embodiment of the invention;

FIGS. 7b and 7c correspond, respectively, to the EDX Oxygen and Aluminium mapping of the same area shown in FIG. 7a;

FIG. 9a shows a scanning electron microscopy image of the Aluminium anodized in oxalic acid (0.3M) at 40V in accordance with a preferred embodiment of the invention;

FIG. 9b is an enlarged view of surface in the white rectangle in FIG. 9a;

FIG. 9c is an enlarged view of the surface in the white dashed rectangle in FIG. 9b;

FIG. 9d is an enlarged view of the surface in the black rectangle in FIG. 9b);

FIG. 10a shows an energy-dispersive X-ray spectroscopy image of the Aluminium anodized in oxalic acid (0.3M) at 40V in accordance with a preferred embodiment of the invention;

FIGS. 10b and 10c correspond, respectively, to the EDX Oxygen and Aluminium mapping of the same area shown in FIG. 10a.

DETAILED DESCRIPTION

As illustrated in FIG. 2a-2d, according to a preferred embodiment of the invention, a master or the master electrode 120 comprising on one of its faces a patterned insulating layer 122 is put into contact (FIG. 2c) with a substrate 110. In the shown example, the entire surface 112 of the substrate comprises a valve metal, although in alternative embodiments, only a portion of the surface may comprise a valve metal. The insulating layer is made of an electrically insulating material, which is inert with respect to the electrolyte solutions described in further detail here below. The insulating layer may comprise complex micro- or microstructured patterns representing a negative image of the micro- or nano-structures that are to be replicated on the substrate. The bottom of each cavity of the pattern is a conductive portion of the master electrode. Methods and devices for patterning such insulating layers are as such known in the art.

Figure 2:
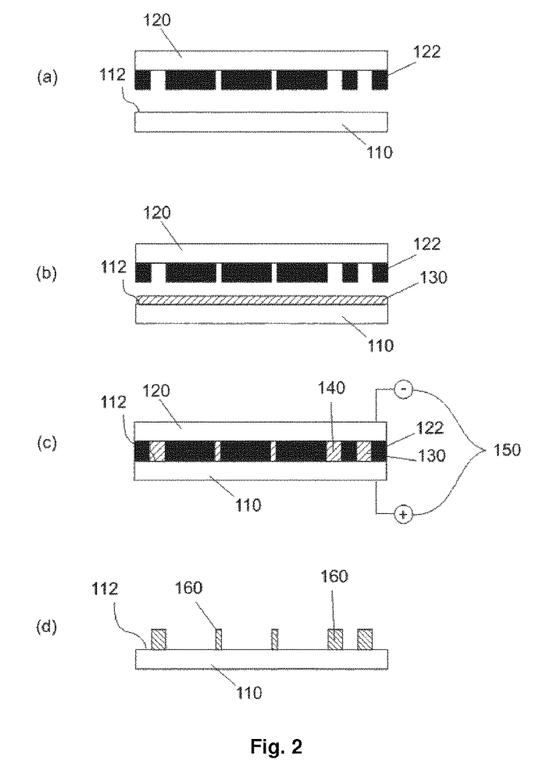
FIG. 2 is an illustration of the local anodization of a substrate against a master by electrochemical lithography according to a preferred embodiment of the invention.

A master electrode 120 may for example be of the type described in the patent document WO 2007058604 A1.

The contact between the master and the substrate is done via a pressurization device that can be, in its most simple form a quick release bar clamp tool or in its most sophisticated form the system described in patent document WO2012/007520A1 (the method for bringing a first substrate in contact with a second substrate and the chuck for holding both the substrates).

In this last form, the positioning of the substrate relatively to the master electrode, also called the alignment of the substrate relatively to the master electrode can be done accordingly to the description made in patent document US2009/0183992A1.

The substrate 110 may be a conductive or a non-conductive material on which one or several metals have been deposited in a multilayer way or in patterned surface inclusion of one or several metal into another(s). Preferably the metal can be selected from the group of valve metals comprising: Aluminum, Titanium, Tantalum, Zirconium, Hafnium and Niobium but it can also be selected in the group comprising: Iron, Vanadium, Tungsten, Cobalt and Silicon. Preferably it can be Aluminium and Titanium, preferably it can be Aluminium.

The metal can also be selected in the alloys of the above cited metals.

The metal may be applied with methods selected from the group comprising: ALD, Metallorganic-Chemical-Vapor-Deposition (MOCVD), PVTD, CVD, electroless deposition, immersion deposition, electrodeposition, electro-grafting, chemical grafting and combinations thereof. The metal may be applied by using a combination of PVD/sputtering and electroless/immersion deposition. The metal may be treated by thermal methods. The thermal methods may be annealing, such as rapid-thermal-annealing (RTA), furnace heating, hot-plate heating or combinations thereof; wherein said methods may be performed in an environment which substantially comprises: vacuum, forming gas, hydrogen gas, nitrogen gas, low oxygen content or combinations thereof.

The substrate can also be the bulk metal or alloy of the above cited metals.

The roughness of the deposited or bulk metal had to be as small as possible to allow an as conformal as possible contact between the master electrode and the substrate.

The substrate can be or can comprise a surface layer of an already anodized metal or of a combination of already anodized metals, either in a non-porous compact oxide layer form or in a non-organized or self-organized compact porous layer form.

The substrate can also be or can comprise a patterned surface layer of an already anodized metal or of a combination of already anodized metals, either in a non-porous compact oxide layer form or in a non-organized or self-organized compact porous layer form.

In a preferred embodiment, prior to pressing the master electrode 120 against the surface portion 112, an electrolyte 130, which is a conductive liquid, is injected on the substrate or on the master electrode as shown in FIG. 2b. Depending on the kind of electrolyte and/or substrates used, non-porous compact oxide layer type or a non-organized or self-organized compact porous oxide layer type can be grown in the local cavities. The electrolyte can be an aqueous solution of neutral pH, between 6 and 8, or of an acid solution at low pH between 0 and 5, preferably between 0 and 3. It can be selected in the following group: fluorhydric acid, sulfuric acid, picric acid, nitric acid phosphoric acid, chromic acid, oxalic acid, malonic acid, tartaric acid, malic acid, citric acid, glycolic acid, acetylene dicarboxylic acid, selenic acid, squaric acid. Alternative methods and devices for charging the cavities 140, shown in FIG. 2c formed by pressing the master electrode 120 against the surface portion 112 may be applied without leaving the scope of the present invention.

The electrolyte delivery system can be, in its simplest form, a filtered solution of the electrolyte delivered before contact onto either the substrate or the master, or, in its more sophisticated form, the system as described in the patent documents WO 2012/007524A1 and WO2012/007554A1 coupled with the master curvature system described in patent document WO 2012/007520A1.

Before the delivery of the electrolyte 130 on the surface of the master or the substrate and before their contact, an alignment step of the master 120 and the substrate 110 can be conducted to allow local anodization at predefine chosen location of the substrate. This is particularly valid for multi-layered fabrication of local anodization. This alignment step would be done accordingly to the description provided in the patent.

As shown in FIG. 2c, a voltage 150 is then applied between the master electrode 120, acting as cathode, and the surface portion 112 acting as anode. The voltage may be a DC constant voltage with a floating current or a DC constant current with a floating voltage. It can be a pulsed current or pulsed voltage to allow the modulation of the diameter of the pores created in a compact porous oxide layer for example or to control the speed of growth of a non-porous compact oxide layer type.

Once the master electrode 120 is removed from the substrate 110, micro- or nano-structures 160 made out of the anodized valve metal have been formed on the substrate 110. The process may be repeated on a different substrate using the same master electrode, possibly after an additional cleaning step thereof.

Figure 3:
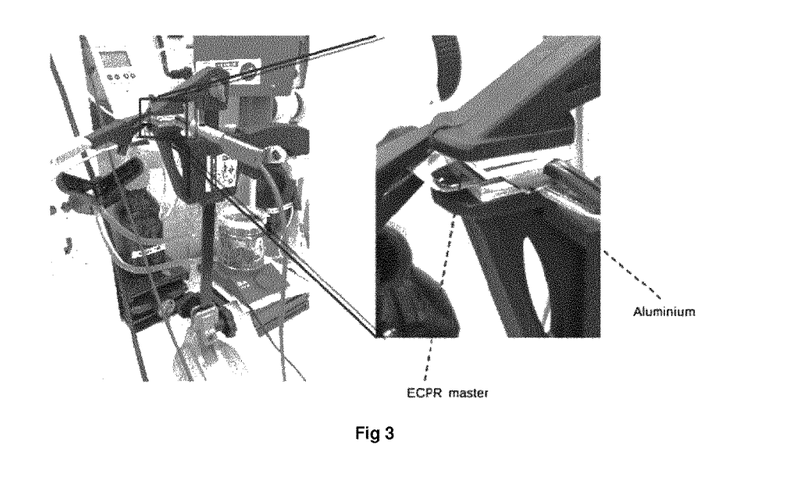
FIG. 3 is an example of an experimental set-up to press the master electrode against an aluminium sample according to a preferred embodiment of the invention.

In the following, a preferred embodiment of the invention is described. A Silicon wafer covered by 2 µm of PVD deposited Aluminium is pressed against a master electrode with a quick release bar clamp tool as described in FIG. 3.

Figure 4:
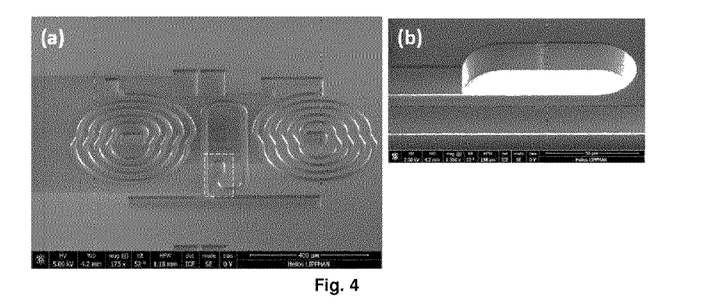

FIGS. 4a and b shows one example of the features observed by scanning electron microscopy (SEM) on the master before being pressed against the Aluminium layer deposited on the Silicon substrate. A widened view of a master cavity on FIG. 4b reveals a depth of about 18 µm.

Figure 5:
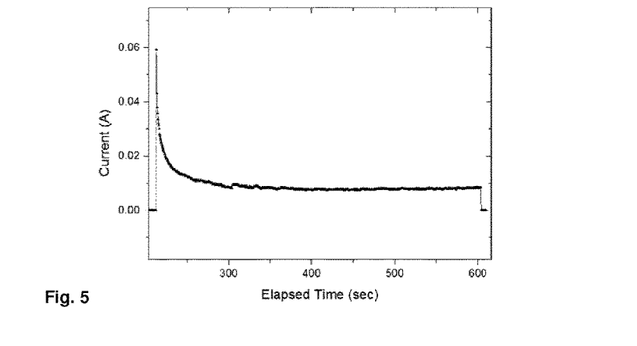
FIG. 5 plots current vs elapsed time registered during application of 12.5V to the sulphuric acid (5%) electrolyte sandwiched in the cavities of the master electrode pressed against the aluminium layer, in accordance with a preferred embodiment of the invention.

Before contact, sulfuric acid solution at 5% in miliQ water has previously been deposited onto the master. The evolution of the current is given in FIG. 5 and shows a curve fairly similar to the one classically observed in literature to anodize the whole surface of an Aluminium sample.

Figure 6:
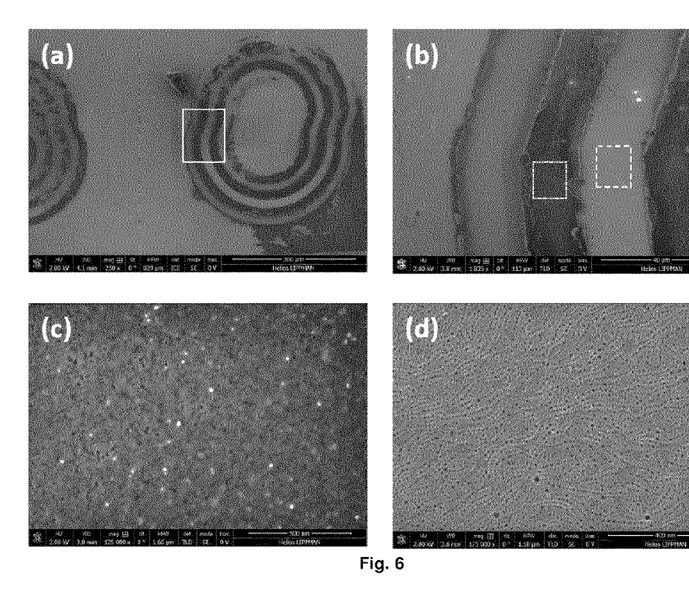
Figure 7:
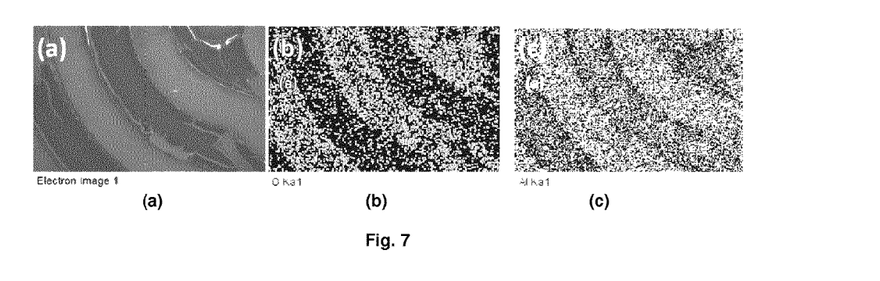

The scanning electron microscopy (SEM) images of the anodized Aluminium sample (FIG. 6a) shows the same spirals features as the one observed on the master (FIG. 4a) before contact with the Aluminium. A SEM examination at different locations on these spirals reveals different surface morphology. Whereas non-organized nanopores typical of an Aluminium first anodization are observed in the area represented on FIG. 6d, no pores can be observed on FIG. 6c. The chemical elemental mapping made with energy-dispersive X-rays spectroscopy (EDX) confirms that the Aluminium is locally more oxygenated in the areas where the porosification occured. The electrochemical lithography process used is then able to perform local anodization of Aluminium.

Figure 8:
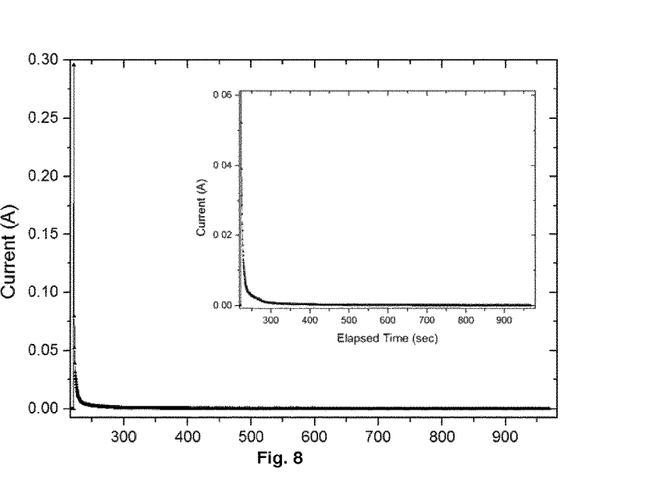
FIG. 8 plots current vs elapsed time registered during application of 40V to the oxalic acid (0.3M) electrolyte sandwiched in the cavities of the master electrode pressed against the aluminium layer in accordance with a preferred embodiment of the invention; the inset is an enlarged view of the curve at weaker currents.
Figure 9:
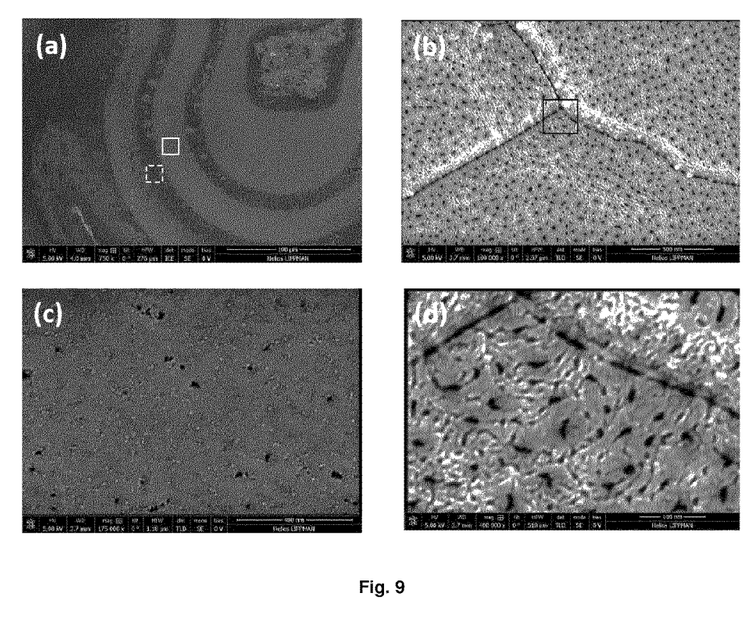
Figure 10:
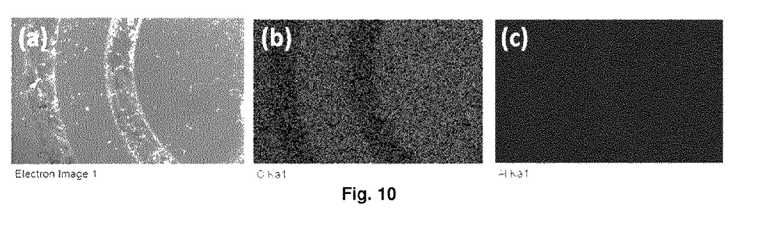

The same experiment has been conducted in oxalic acid solution at 0.3M in miliQ water submitted to a voltage of 40V during 10 minutes. FIGS. 8 and 9 and 10 show the results obtained and clearly confirm that the electrochemical lithography process is also able to perform local anodization of Aluminium in oxalic acid.

The invention claimed is:

1. A pattern replication method for production of micro- or nano-structures of an anodized valve metal on a substrate, wherein a replication pattern is defined by an electrically insulating patterned material of a master electrode, and wherein said method comprises:

providing a substrate having at least one surface portion that comprises a valve metal;

placing the master electrode in direct contact with said surface portion, so that micro- or nano- cavities are delimited by the direct contact between the insulating pattern of the master electrode and said surface portion;

charging said cavities with an electrolyte being an aqueous solution of neutral pH or an acid solution of low pH;

applying a voltage between the master electrode being the cathode and the surface portion being the anode, in order to locally anodize the surface portions inside said micro- or nano- cavities; and releasing said master electrode from said substrate.

2. The method according to claim 1, wherein the valve metal comprises Aluminium, Titanium, Tantalum, Zirconium, Hafnium or Niobium.

3. The method according to claim 1, wherein the surface portion comprises an anodized valve metal.

4. The method according to claim 1, wherein the electrolyte comprises fluorhydric acid, sulfuric acid, picric acid, nitric acid, phosphoric acid, chromic acid, oxalic acid, malonic acid, tartaric acid, malic acid, citric acid, glycolic acid, acetylene dicarboxylic acid, selenic acid or squaric acid.

5. The method according to claim 1, wherein the substrate comprises said valve metal.

6. The method according to claim 1, wherein the method comprises the step of depositing a layer of valve metal on a portion of said substrate, thereby creating said surface portion.

7. The method according to claim 1, wherein said electrolyte is provided on said surface portion of the substrate or in the cavities of the insulating pattern prior to placing said master electrode and said surface portion into contact.

8. The method according to claim 1, wherein a constant voltage is applied between the anode and the cathode.

9. The method according to claim 1, wherein a pulsed voltage is applied between the anode and the cathode.

10. The method according to claim 1, wherein a constant current is applied between the anode and the cathode.

11. The method according to claim 1, wherein the voltage is applied during 5 to 10 minutes.

12. Use of the method according to claim 1 for the production of any of an electronics device, a sensing device, or a filtering device, said device comprising said micro- or nano-structured substrate.

* * * * *